United States Patent [19]

Wuchinich et al.

[11] 4,049,964
[45] Sept. 20, 1977

[54] OPTICAL SWITCHING DEVICE

[75] Inventors: David G. Wuchinich, New York; Joseph Tarsia, Valley Stream, both of N.Y.

[73] Assignee: Cavitron Corporation, New York, N.Y.

[21] Appl. No.: 672,829

[22] Filed: Apr. 1, 1976

[51] Int. Cl.² ............................................. G01D 21/04
[52] U.S. Cl. ...................... 250/221; 250/229; 250/239; 340/365 P
[58] Field of Search ............... 250/221, 222, 229, 239, 250/216; 340/365 P

[56] References Cited

U.S. PATENT DOCUMENTS

| 2,168,886 | 8/1939 | Roberts | 250/221 |
| 3,603,982 | 9/1971 | Patti | 250/229 |
| 3,648,050 | 3/1972 | Koo | 250/229 |
| 3,767,022 | 10/1973 | Olson | 340/365 P |
| 3,856,127 | 12/1974 | Halfon et al. | 340/365 P |

Primary Examiner—David C. Nelms
Attorney, Agent, or Firm—Philip Sperber

[57] ABSTRACT

A novel electro-optical switch is shown comprising a fixedly mounted lamp, a solid state photo-responsive transistor mounted in position to receive light from the lamp for responsively switching from one state to a second state and actuation means intermediate the transistor and the lamp for obstructing the light path between the lamp and the transistor.

3 Claims, 2 Drawing Figures

OPTICAL SWITCHING DEVICE

BACKGROUND OF THE INVENTION

This invention relates to an electrical switching device; more particularly it relates to an electro-optical switching device that has as its principal function controlling an electrical circuit. There exist a great many types of switching devices and further discussion would be prohibitively extensive and to a large extent immaterial.

The device according to the present invention is a miniature, highly reliable and rather moisture resistant device adaptable to many uses but designed as an operator activated switch placed upon an operator manipulated handpiece for controlling operation of the handpiece. More specifically, it is designed for use on a surgical handpiece for actuation by the surgeon as desired. Hence, it is desirably reliable, small and impervious to fluids. The device utilizes as a basis of operation, a light responsive solid state element activated by a light source with a means for blocking off the light emanating from the light source to activate the light responsive element.

It is thus an object of this invention to provide a novel switching device; it is another object of the present invention to provide a miniature operator-actuated switching device;

It is yet another object of this invention to provide a highly reliable electrical switching device;

Still another object of the present invention is to provide a switching device impervious to fluids.

Other objects and advantages of the present invention will be apparent from the descriptions of the drawing and preferred embodiments which follow.

SUMMARY OF THE INVENTION

We have invented a switching device comprising a frame, a fixedly mounted light source thereon, a solid state light responsive element mounted in position to receive light along a directed path from the light source and which element responsively switches from one state to a second state in the presence or absence of light. and actuation means for obstructing the light path. More particularly, the light path between the light source and the light responsive element comprises a reflective surface for receiving the light from the source and directing the light at the light responsive element. The actuation means obstructs the light by preventing the reflective surface from directing the light at the light responsive element. Preferably, the actuation means is a translucent or transparent elastic cap enclosing the light responsive element mounted on the frame and mounting the reflective surface opposite and at a spaced distance from the light responsive element. Forceably depressing the cap reduces the distance between the reflective surface and the light responsive element and obstructs the light path thereby. The light responsive element is preferably a photo-sensitive transistor functionally connected to and controlling a desired operational circuit.

DESCRIPTION OF THE PREFERRED EMBODIMENT

Certain applications of electrical switching requirements demand a highly reliable miniature waterproof, electrically sealed type of switching device rather than those currently available off the shelf. Most electrical switching devices require contacts and moving parts with the consequent problems of contact failure and the difficulty of waterproofing a commercially practical miniature switching device. Our invention overcomes such disadvantages to provide a miniature, waterproof, electrically contactless switching device which can be unobtrusively mounted on any desired surface or tool piece for convenient and reliable operation.

The device utilizes as a principle of operation a light responsive element actuated by light or the absence of same; a light source suitable for actuating the light responsive element positioned to project light at a reflective surface movably spaced apart from the responsive element and which reflects the light beam at the responsive element; and actuation means for moving the reflective surface to a second position which removes or directs the light away from the sensitive element, thus removing the excitation from the responsive element and 'switching' it from one active state to a second active state.

Figure 1:
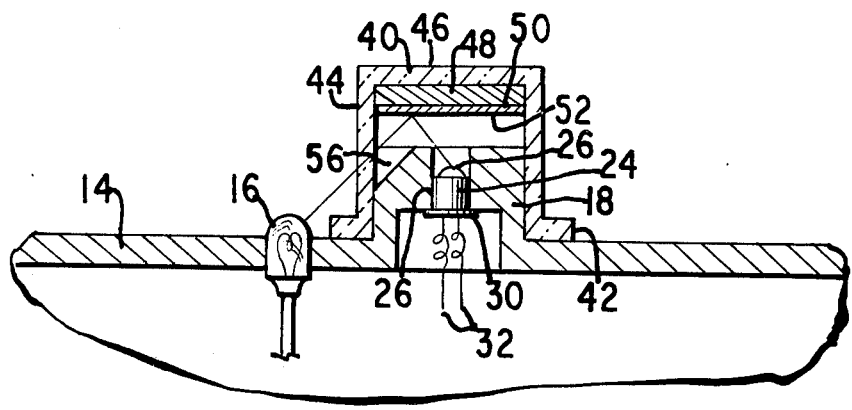
FIG. 1 is a cross-sectional view of the switching device of the present invention in normal mode.

Referring now to FIG. 1 of the drawings, a cross-sectional view of a preferred "optical" switch 12 is shown mounted on the surface of a handpiece 14. For the purpose of obtaining miniaturization of the switching device, the light source (a miniature incandescent lamp 16) is mounted on the handpiece adjacent the main structure of the switch 12. While a miniature incandescent lamp is shown in this embodiment, it should be understood that any suitable light source can be employed, as for instance a light emitting diode (LED), a neon light or other fluorescent light; ambient light source may be appropriate in some circumstances.

A miniature cylindrically shaped nipple 18 is molded into the handpiece adjacent the lamp. It has centrally located therein a small tubular bore 20 sized to receive and hold (in its lower portion) a light responsive phototransistor 24 with a photo-sensitive end 26 facing outwardly in the bore 20 through an outside opening 28 on the nipple.

The transistor's photo-sensitive end 26 is recessed in the bore a sufficient distance so that no light rays passing substantially parallel to the nipple surface and the bore would enter the bore 20. The bottom of the nipple is counterboard either by molding or by machining and serves to retain the photo-transistor by the latter's rim 30, thereby providing a satisfactory and simple means for properly positioning the transistor. Two conductive leads 32 extend from the bottom of the transistor to circuitry (not shown) dependent upon the operation of the photo-transistor as a contactless switch.

Positioned on the nipple is a pliable, resilient transparent cap 40, fully enclosing the nipple and being retained on the nipple by its compressive elasticity. As shown, the cap 40 has a bottom flange 42, a tubular upright wall 44 and a circular cover 46 molded of a suitable transparent elastomeric plastic material. An example of a suitable material for use in molding the cap 40 is any surgical grade plastic material. Mounted within the cap 40 and adhering to the internal surface of the cover 46 and the adjacent wall is a pliable pressure disc 48. On the underside of the pressure disc 48 and adhering thereto is a light opaque reflector 50, having a flat reflective surface 52 facing toward the photo-transistor. The height of the cap wall 44 relative to the depth of the nipple 18, and pressure disc is sufficiently great so as to provide an open space 54 between the reflector 50 and the top of the nipple 18. This space allows light rays emanating from the lamp 16 to be reflected into the bore and impinge upon the photo-transistor's photo-sensitive end 26, as is clearly shown in FIG. 1 of the drawings.

An inclined slot 56 is located in the side of the nipple and is aligned with its major axis from the nipple and cap centerline toward the lamp. Preferably, the slot has its inclined bottom surface substantially parallel to the axis of the light rays from the lamp which are reflected and impinge upon the photo-transistor.

Figure 2:
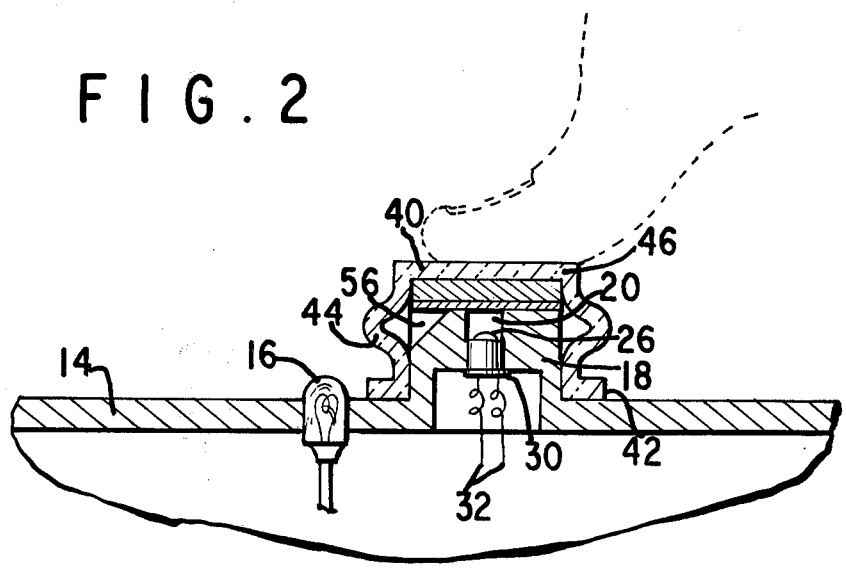
FIG. 2 is a cross-sectional view of the switching device of FIG. 1 in the actuated mode.

Referring now to FIG. 2 of the drawings, where the switch 12 is shown in actuation mode, such mode is obtained by the application of sufficient force to the cap to reduce the space 54 between the reflector and the nipple sufficiently to prevent light from the lamp from being reflected toward the photo-transistor.

As previously described, the cap wall 44 is preferably made of an elastic, resilient or elastomeric material which enables the wall to bend, flex, compress or similarly function so as to substantially decrease the space between the reflector and the nipple and thereby prevent light rays from entering the bore. The photo-transistor will then go from a light responsive state to a non-light responsive state and suitably control an electrical circuit in which it is functioning to switch the circuit from one mode to a second or sequential mode.

The embodiment described above has several advantages over the conventional switching device. First, there are no moving parts in the accepted sense of the word. The cap is preferably a unitary part serving as the "moving part" of the switch. Its functional life is limited only by the ability of the cap material to resist failure under repeated flexure. Second, the cap also acts as an encapsulating enclosure for the reflector, the nipple and the photo-transistor making the switch moisture and tamper resistant. Third, the cap is itself easily replaced simply by removing it from the nipple. While the preferred embodiment is described herein, it is to be understood that variations and modifications thereof would be apparent from the description. Thus, one variation may be an embodiment in which the lamp is mounted on the nipple within the cap and adjacent the bore, i.e., side by side with the photo-transistor but separated by some sort of partition. In such a variation, the cap need not be transparent or translucent.

The positioning of the lamp outside the cap may secondarily serve to indicate that the switching device is operational; i.e., fingertip depression of the cap would serve to actuate the switching device.

Having fully described our invention and wishing to cover those modifications and variations which would be apparent to those skilled in the art, but without departing from either the spirit or the scope thereof.

We claim:

1. A contactless, electrical switching device, comprising:
   a nipple projecting from the surface on which the switching device is mounted and having a top surface, said nipple having a bore that intersects said top surface to provide an opening therein;
   a photo-sensitive element located within said bore and having its photo-sensitive portion (1) facing outwardly from the device mounting surface, and (2) operable in response to light received through said opening,
   a resilient, transparent cap that (1) fully encloses said nipple, (2) is retained on said nipple by said cap resiliency and (3) has a cover with a pliable, opaque pressure disc retained in spaced-relation to said top surface by said resilient cap to provide an open space between said top surface and said disc that allows light to impinge on said photo-sensitive portion through said opening, said disc being retained in said cover (a) to prevent light from reaching said photo-sensitive upon the application of sufficient pressure to overcome the resiliency of said cap by blocking said opening and (b) to permit light to reach said photo-sensitive portion upon the removal of pressure on said resilient cap, and
   utilization means coupled to said photo-sensitive element for taking advantage of the response of said photo-sensitive portion to the presence and absence of light received through said opening.

2. A switching device according to claim 1, wherein said pressure disc has a flat reflector surface in facing relationship to said top surface for reflecting light to said photo-sensitive element and further including a light source mounted adjacent said nipple and transparent cap on the surface from which the nipple projects to assure the operability of said device in low ambient light conditions.

3. A switching device according to claim 2 wherein said nipple includes an inclined slot between said photo-sensitive element and said light source to limit the blockage of light being reflected from said source to said element while preventing light from passing directly from said source to said element.

* * * * *